US005285079A

United States Patent [19]

Tsukamoto et al.

[11] Patent Number: 5,285,079

[45] Date of Patent: Feb. 8, 1994

[54] ELECTRON EMITTING DEVICE, ELECTRON EMITTING APPARATUS AND ELECTRON BEAM DRAWING APPARATUS

[75] Inventors: Takeo Tsukamoto, Atsugi; Nobuo Watanabe, Gotenba; Masahiko Okunuki, Tokyo, all of Japan

[73] Assignee: Canon Kabushiki Kaisha, Tokyo, Japan

[21] Appl. No.: 48,946

[22] Filed: Apr. 20, 1993

Related U.S. Application Data

[63] Continuation of Ser. No. 665,582, Mar. 6, 1991, abandoned.

[30] Foreign Application Priority Data

Mar. 16, 1990 [JP] Japan .................................. 2-063970
Feb. 15, 1991 [JP] Japan .................................. 3-078679

[51] Int. Cl.[5] .................. H01L 29/161; H01L 29/205; H01L 29/225; H01J 1/14

[52] U.S. Cl. .......................................... 257/10; 257/11; 313/346 R; 313/366

[58] Field of Search .................. 357/16; 313/346, 366; 257/10, 11

[56] References Cited

U.S. PATENT DOCUMENTS 4,000,503 12/1976 Matare .................................. 357/16
4,370,797 2/1983 van Gorkom et al. ............. 313/366
5,031,015 7/1991 Miyawaki ............................ 357/16

OTHER PUBLICATIONS

Schade et al, 'Novel GaAs-(AlGa)As Cold Cathode . . . ', Appl Phys Lttr, vol. 20 #10, 15 May 1972, pp. 385-387.

Kan et al, 'New Structure . . . Cold Cathode', Tromson ED, vol. ED-26 #11, Nov. 1979, pp. 1759-1766.

Milnes et al, 'Heterojunction Photocathode Concepts', Appl Phys Lttr, vol. 19 #10, 15 Nov. 1971, pp. 383-385.

Clark et al, '. . . heterojunction Structure . . . of cathode contact . . . ' Conference of Inst Phys, 1974, pp. 373-376.

*Primary Examiner*—Andrew J. James
*Assistant Examiner*—Stephen D. Meier
*Attorney, Agent, or Firm*—Fitzpatrick, Cella, Harper & Scinto

[57] ABSTRACT

An electron emitting device is provided for use in a flat display, an electron beam drawing apparatus, a CRT display and so on. The electron emitting device comprises a first layer having a first bandgap, a second layer formed on the first layer and having the first bandgap, a third layer formed on the second layer and having a second bandgap, which is narrower than the first bandgap, and a fourth layer formed on the third layer and having an electron emitting surface. According to this structure, a high electron emission efficiency can be obtained.

14 Claims, 7 Drawing Sheets

ELECTRON EMITTING DEVICE, ELECTRON EMITTING APPARATUS AND ELECTRON BEAM DRAWING APPARATUS

This application is a continuation of application Ser. No. 07/665,582 filed Mar. 6, 1991, now abandoned.

BACKGROUND OF THE INVENTION

1. Field of the Invention

This invention relates to a solid electron emitting device having an NPN transistor structure and applicable to a flat display, an electron beam drawing apparatus or a CRT display, and more particularly to a solid electron emitting device having improved emission efficiency.

2. Description of Related Art

A typical electron emitting device is disclosed in J. Vac. Scv. Techonol. B4(1), 1986, P105. FIG. 4 shows an energy band of an NPN transistor structure disclosed therein. In this structure, electrons are injected from an emitter into a base region and some of the electrons passing through an extremely thin base are changed into thermoelectrons by an electric field between the base and a collector. Those electrons increase in kinetic energy, thereby being emitted into a vacuum.

However, in the above conventional art, since sufficient kinetic energy cannot be given to the electrons by only the electric field between the base and the collector, it is difficult to emit the electrons into the vacuum. An energy band of a device attempting to solve the above problem is shown in FIG. 5. Such a device aims to join semiconductors having different bandgaps between an emitter and a base and to form a heterojunction, so as to give kinetic energy to electrons with the use of the discontinuous width ΔEc of a band at the junction. However, according to this structure, since the heterojunction is formed in a depletion layer between the emitter and the base, ΔEc is smaller than ΔEc formed outside of the depletion layer, and thereby the emission efficiency of the electrons is low.

SUMMARY OF THE INVENTION

It is an object of this invention to provide an electron emitting device to solve the above problem.

According to one aspect of this invention, there is provided an electron emitting device, in which an emitter region has a first bandgap, and a base region has a first base area having the first bandgap and a second base area having a second bandgap narrower than the first bandgap to form a heterojunction in the base region. A collector region is further provided having an electron emitting surface mounted thereon. Electrons are injected from the emitter region to the base region, and a reverse bias is applied to the base region and the collector region, thereby emitting the electrons from the electron emitting surface.

According to one aspect of the invention, an electron emitting device comprises a first layer having a first material having a first bandgap and a second layer having the first bandgap disposed on the first layer. A third layer is provided comprising a second material having a second bandgap disposed on the second layer. The second bandgap is narrower than the first bandgap. A fourth layer, having an electron emitting surface, is disposed on the third layer.

According to another aspect of the invention, a bias voltage is applied among the second, third and fourth layers.

According to a further aspect of the invention, an electron emitting device comprises an emitter layer and a base layer, the base layer having a first base portion and a second base portion. A collector layer is provided having an electron emitting layer. A means is further provided for applying a reverse voltage between the base layer and the collector layer. The emitter layer and the first base layer each comprise a first material having a first bandgap, and the second base portion comprises a second material having a second bandgap. The second bandgap is narrower than the first bandgap. The first base layer and the second base layer form a heterojunction.

According to yet another aspect of the invention, a display apparatus comprises an electron emitting device. A means is provided for deflecting electrons emitted from the electron emitting device. A fluorescent substance is illuminated by the electron emitting device in response to the deflecting means.

According to still yet another aspect of the invention, an electron emitting apparatus includes a plurality of electron emitting devices arranged in a matrix on a substrate.

According to yet a further aspect of the invention, a display apparatus comprises an electron emitting apparatus including a plurality of electron emitting devices arranged in a matrix on a substrate. A fluorescent substance is provided for being illuminated by the electron emitting devices in response to an address means.

According to still yet a further aspect of the invention, an electron beam drawing apparatus comprises an electron emitting apparatus including a plurality of electron emitting devices arranged in a matrix on a substrate. A means is provided for focusing electrons emitted by the electron emitting apparatus. A means is further provided for controlling a first period of time when the electron emitting apparatus emits the electrons in accordance with the focusing means and for controlling a second period of time when the electron emitting apparatus is prohibited from emitting the electrons.

DETAILED DESCRIPTION OF THE PREFERRED EMBODIMENTS

According to an embodiment of this invention, in an NPN transistor structure, a heterojunction of P-type semiconductors having different bandgaps is formed in a P-type semiconductor region corresponding to a base layer, and a semiconductor having a large bandgap is formed on the side of an emitter between the emitter and the base region.

Figure 2:
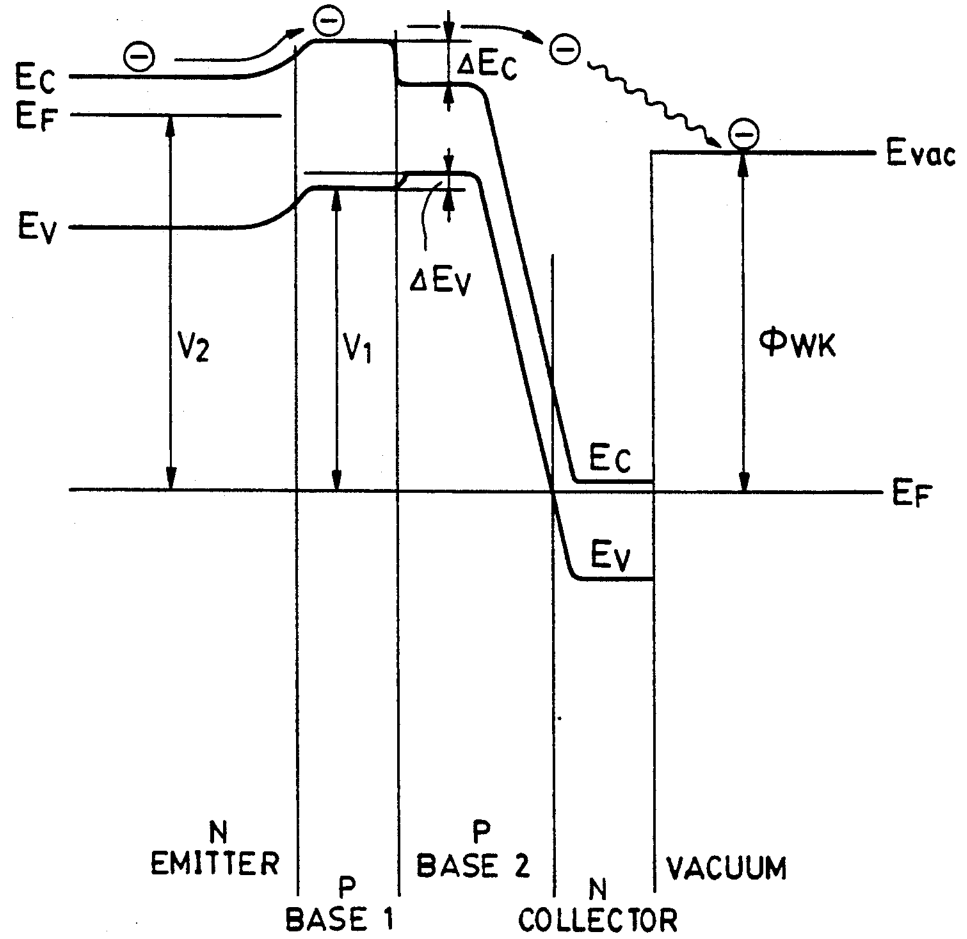
FIG. 2 is a view of an energy band when a bias is applied to the device of the first embodiment.

The operation of this invention will now be described with reference to an energy band chart shown in FIG. 2. According to this structure, as shown in FIG. 2, since band discontinuity $\Delta Ec$ of a conduction band is necessarily formed at a position where the energy potential of electrons is the highest, thermoelectrons can be produced where the energy potential is the highest. Furthermore, the maximum band discontinuity $\Delta Ec$ can be created, and therefore, a high electron emission efficiency can be obtained by applying larger than conventional kinetic energy to the electrons.

In an electron emitting device of this invention, desirable ranges of carrier density of an emitter layer, a first base layer, a second base layer and a collector layer are $1\times10^{17}\sim1\times10^{18}$ $cm^{-3}$, $5\times10^{18}\sim1\times10^{20}$ $cm^{-3}$, $1\times10^{18}\sim2\times10^{19}$ $cm^{-3}$ and $1\times10^{18}\sim1\times10^{19}$ $cm^{-3}$, in this order. Desirable ranges of thickness of these layers are $1\times10^{-5}\sim1\times10^{-4}$ cm, $1\times10^{-6}\sim1\times10^{-5}$ cm, $1\times10^{-6}\sim1\times10^{-5}$ cm and $1\times10^{-6}\sim1\times10^{-5}$ cm, in this order.

In general, it is preferable that the base-collector bias voltage be more than 2 v when an electron emitting surface of the emitter is made of a material having a low work function and that it is more than 5 V when the electron emitting surface is made of a semiconductor material. On the other hand, it is generally preferable that the base-emitter bias voltage be more than 1 V.

It is possible to use, for a combination of a material having a first bandgap (a first base region) and a material having a second bandgap (a second base region), a combination of materials having near lattice constants, such as $Al_xGa_{(1-x)}As$ ($0\leqq x\leqq 1$) and GaAs, $Al_xGA_{(1-x)}P$ ($0\leqq x\leqq 1$) and Si, GaAs and Ge, Si and Ge, InAs and GaSb, ZnSe and GaAs, ZnSe and Ge, or CdS and InP.

Furthermore, it is possible to form a layer made of a material including an alkali metal component, which has a low work function, on the electron emitting surface of the collector region.

The present invention will now be specifically described with reference to preferred embodiments.

EMBODIMENT 1

Figure 1:
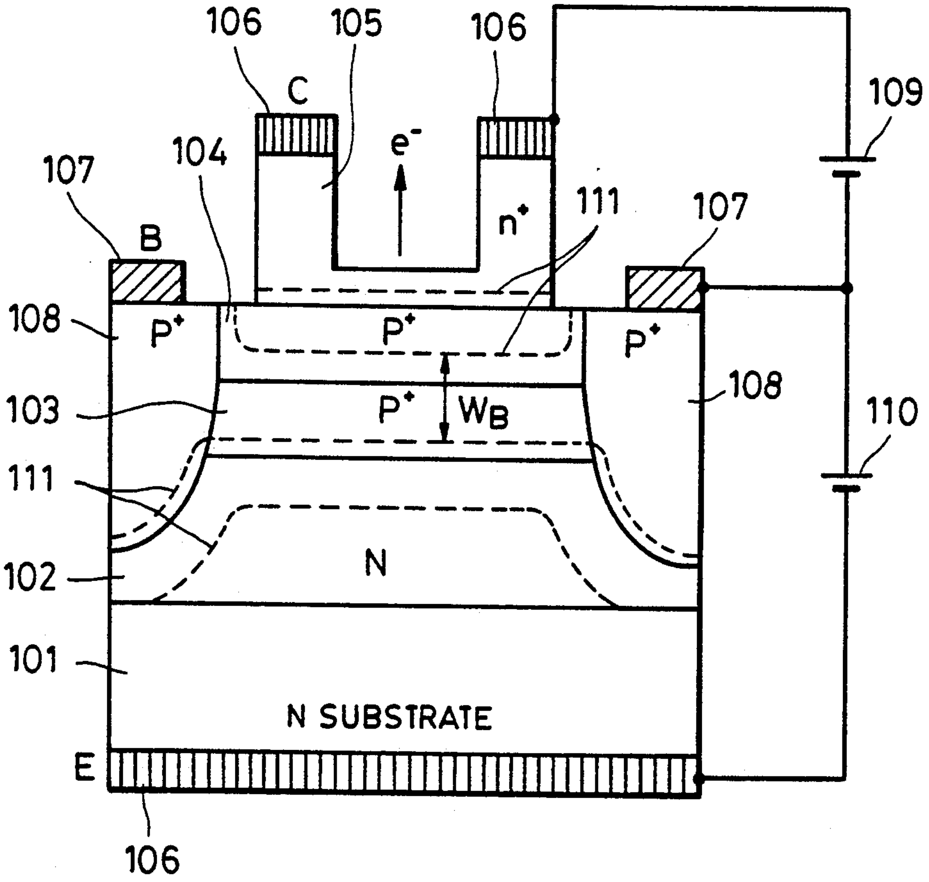
FIG. 1 is a cross-sectional view showing the structure of a device according to a first embodiment of this invention.

FIG. 1 is a cross-sectional view showing the structure of the first embodiment of this invention which uses an N-type GaAs substrate 101. Referring to FIG. 1, numeral 102 denotes an N-type $Al_xGA_{1-x}As$ layer which functions as an emitter. Subscript x designates a constant representing the composition of the mixed crystal and $0\leqq x\leqq 1$. Numerals 103 and 104 denote a first base layer composed of the same semiconductor as that of the emitter and a second base layer composed of a GaAs semiconductor, respectively. A collector layer 105 is composed of the same semiconductor as that of the second base layer and Cs (cesium), Cs-O (cesium-oxygen), Ba or the like. Such a material has a low work function, and may be attached thereto in order to increase the electron emission efficiency. Numerals 106 and 107 denote an ohmic contact electrode for the N-type semiconductor and an ohmic contact electrode for the P-type semiconductor, respectively. A P-type Be (beryllium) ion injection region 108 forms a contact with the base. Numerals 109 and 110 denote power supplies for bias. The layers 102 to 105 are formed by the molecular beam epitaxial growth (MBE). The carrier density and thickness thereof are as follows: the carrier densities of the emitter layer 102, the first base layer 103, the second base layer 104 and the collector layer 105 are $5\times10^{17}$ $cm^{-3}$, $1\times10^{19}$ $cm^{-3}$, $2\times10^{18}$ $cm^{-3}$ and $3\times10$~$cm^{-3}$, and the thicknesses of the emitter layer 102, the first base layer 103, the second base layer 104 and the collector layer 105 are $7\times10^{-5}$ cm, $5\times10^{-6}$ cm, $8\times10^{-6}$ cm and $5\times10^{-6}$ cm. These carrier densities and thicknesses are found according to the C-V method. The growing method and the carrier density and thickness of the layers are not limited to the above method and numerical values.

The operation of this invention will now be described with reference to an energy band chart when a bias is applied as shown in FIG. 2. When a forward bias is applied from the power supply 110 between the base and the emitter, electrons in the emitter layer are injected into the first base region. The injected electrons cross the heterojunction between the second base region and the first base region while passing through the base. At this time, the volume $\Delta Ec$ of the band discontinuity due to the heterojunction varies depending on the combination of the material constituting the first base region and the material constituting the second base region. For example, if Al0.3Ga0.7As and GaAs are used, $\Delta Ec$ is approximately 0.3 eV. This energy difference changes the injected electrons in the base into thermoelectrons. Such thermoelectrons are accelerated by the electric field between the base and the collector, are supplied with sufficient kinetic energy, and thus, allowed to be emitted into the vacuum. The collector layer 105 is configured to be as thin as possible so that the electrons having a large amount of energy do not lose the energy due to scattering and so on. The work function of the surface thereof is lowered by applying Cs (cesium) onto the surface so as to emit many electrons.

EMBODIMENT 2

Figure 3:
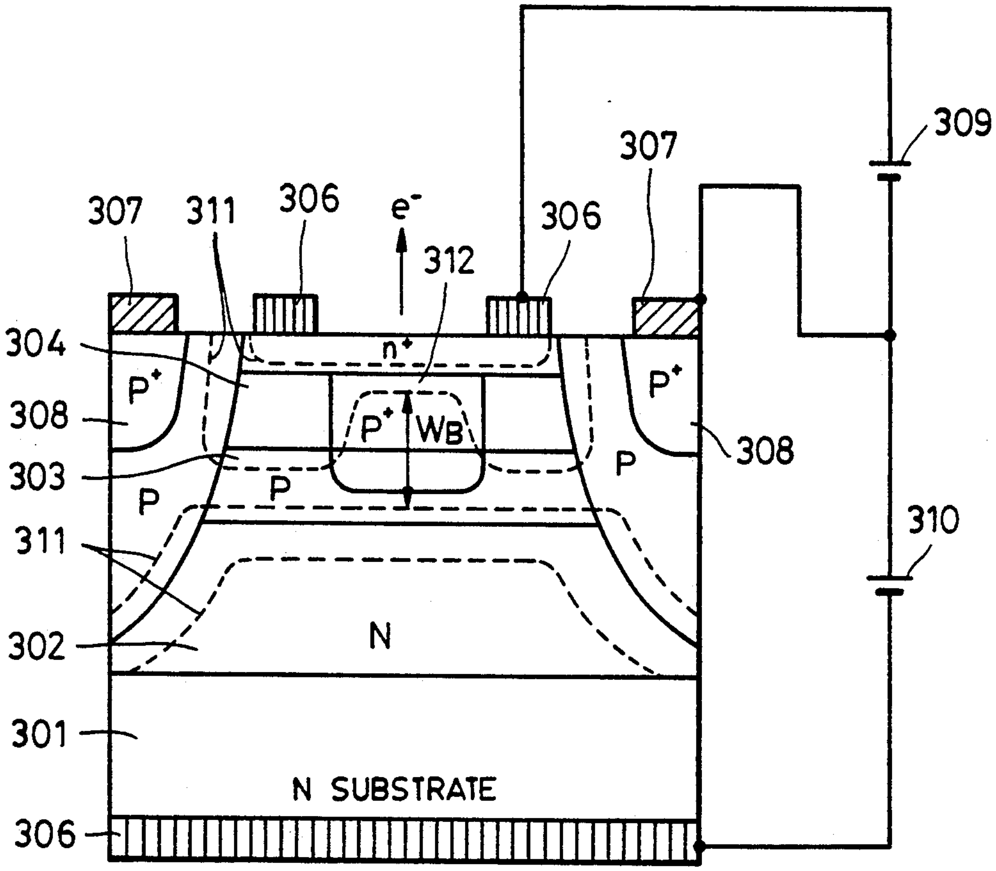
FIG. 3 is a cross-sectional view showing the structure of a device according to a second embodiment of this invention.
Figure 4:
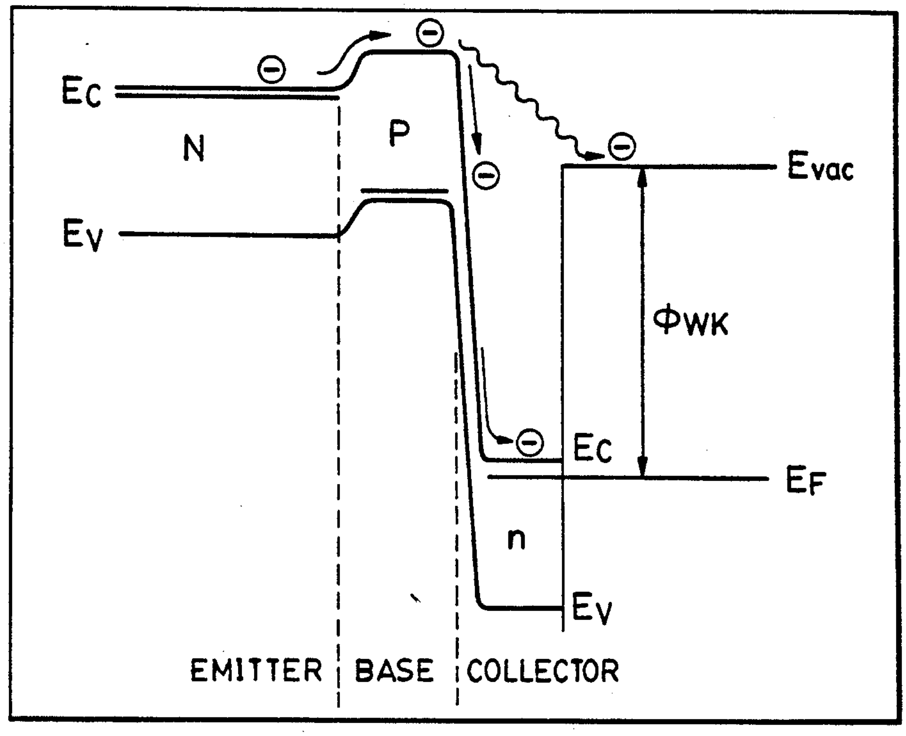
FIGS. 4 and 5 are views of energy bands of the related art.
Figure 5:
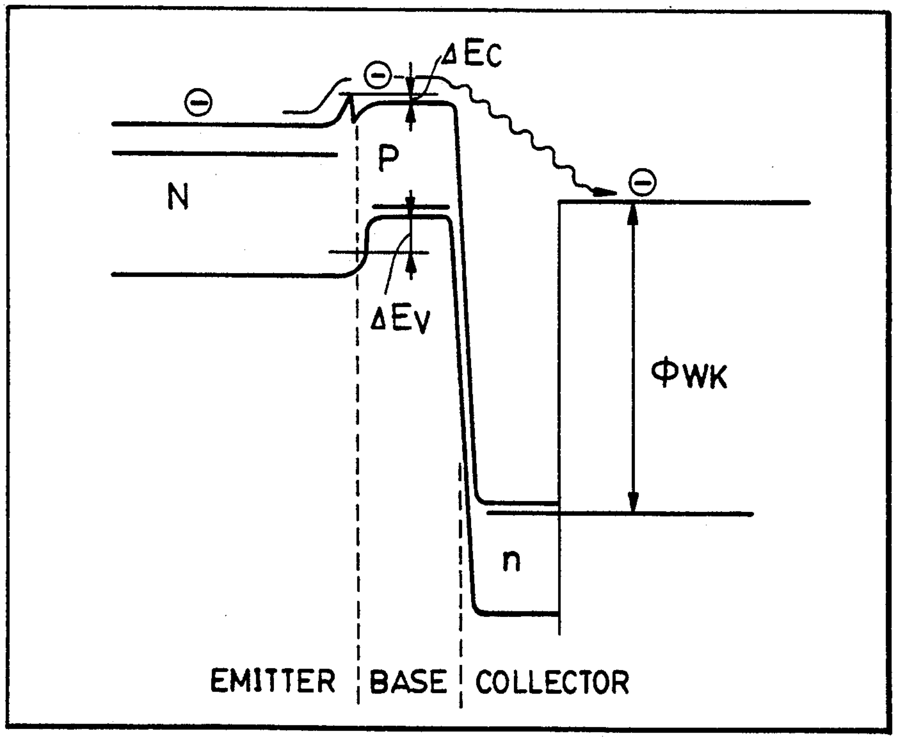

FIG. 3 shows a second embodiment of this invention.

The structure, thickness and carrier density of layers are the same as those in the embodiment 1, shown in FIG. 1, except that the carrier density of first and second base layers 303 and 304 is $1\times10^{17}$($cm^{-3}$). In this structure, a P+ region 312 is formed by injecting Be ions. The carrier density of the P+ region 312 is $1\times10^{19}cm^{-3}$ according to the measurement with the C-V method. Thereby, a depletion layer 311 is formed as shown in FIG. 3 so as to make an electric field formed between the base and the collector in the P+ region 312 higher than an electric field formed in other regions of the base layer. Therefore, it is possible to permit the electron emission only in the region 312 and to allow the electrons to be emitted from a specific region. It is also possible to produce the whole device on the same plane, to integrate a large number of devices and to facilitate the combination of this device and other devices.

As described above, according to the electron emitting device of this invention, the following advantages can be obtained:

① Since there are different bandgaps in the base regions of an NPN transistor (the bandgap of the first base is larger than that of the second base), the number of carriers to be injected is larger than that of a device in which the bandgap is uniform in the base and the emitter and a device in which different bandgaps are used in the base and the emitter, and it is possible to convert the electrons injected in the base into thermoelectrons by giving large kinetic energy to the electrons. As a result, the electron emission efficiency is remarkably enhanced.

② Since an electron emitting device can be produced by using a semiconductor material, it is easy to integrate a plurality of electron emitting devices on a single substrate and to combine the electron emitting device with a device having another function.

As a result, an integrated device having a new function can be realized.

The cases in which an electron emitting device of this invention is applied to various kinds of apparatuses will now be described.

Figure 6:
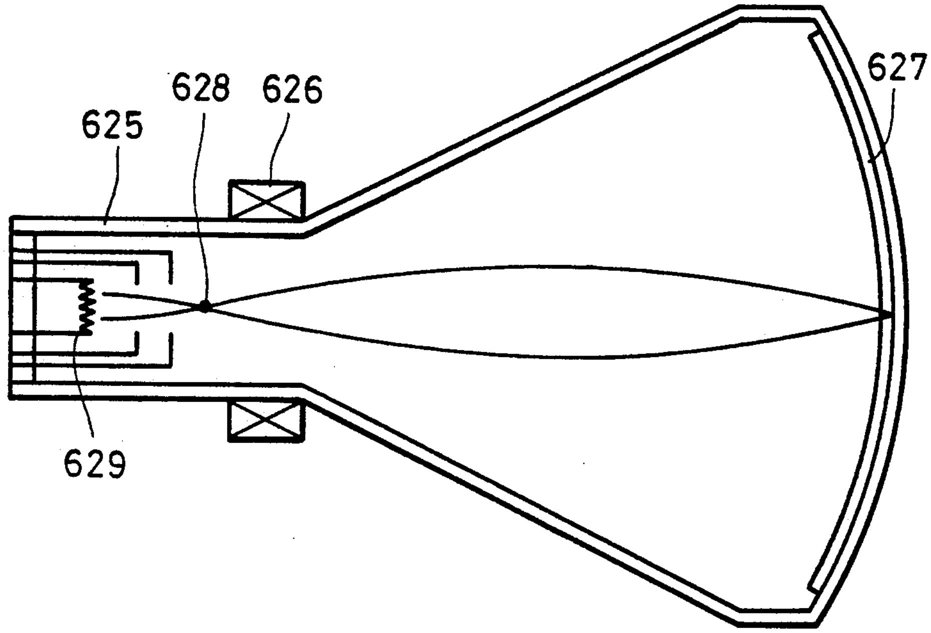
FIG. 6 is a schematic view of a conventional CRT display.
Figure 7:
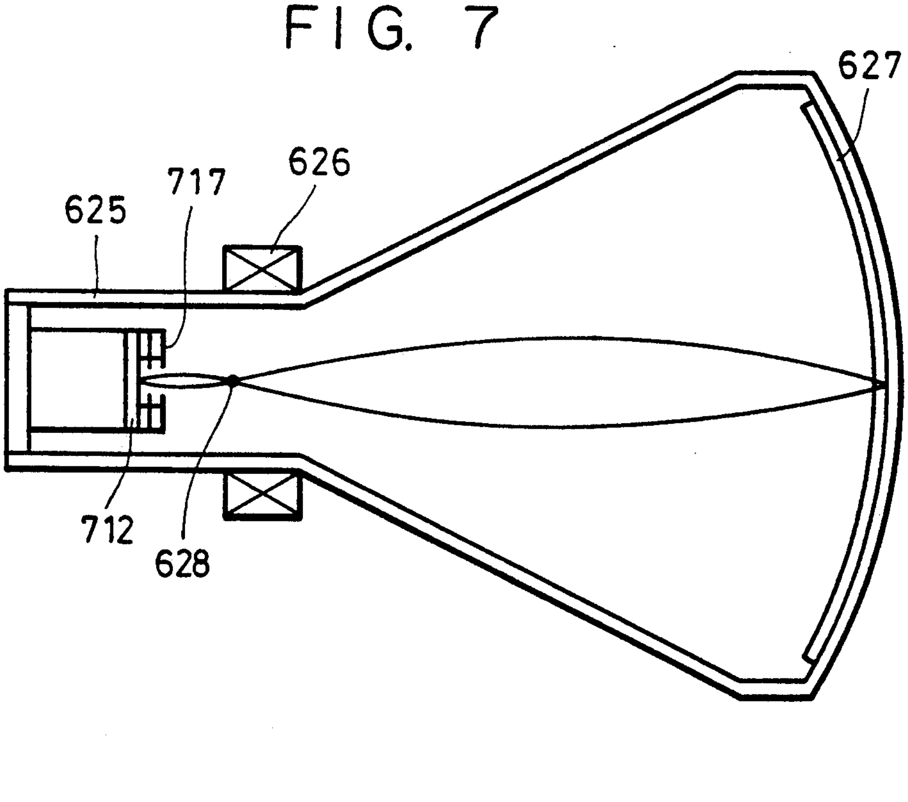
FIG. 7 is a schematic view of a CRT display to which an electron emitting device of this invention is applied.

FIGS. 6 and 7 illustrate application examples in which an electron emitting device of this invention is applied to a CRT display. FIG. 6 is a schematic cross-sectional view of a conventional CRT display, which is comprised of a glass tube 625, a deflecting coil 626 as an electron deflecting means, a fluorescent screen 627, a crossover point of electrons 628 and a filament 629 as a thermoelectron source. FIG. 7 shows the case in which an electron emitting device of this invention is substituted for the above electron source. Referring to FIG. 7, a lens electrode 717 is formed so that a crossover point is disposed in the same position as that in FIG. 6 and an electron emitting device 712 of this invention is used, thereby achieving a long-lived and stable CRT.

An application example in which many electron emitting devices of this invention are arranged on a single substrate will be described.

Figure 8:
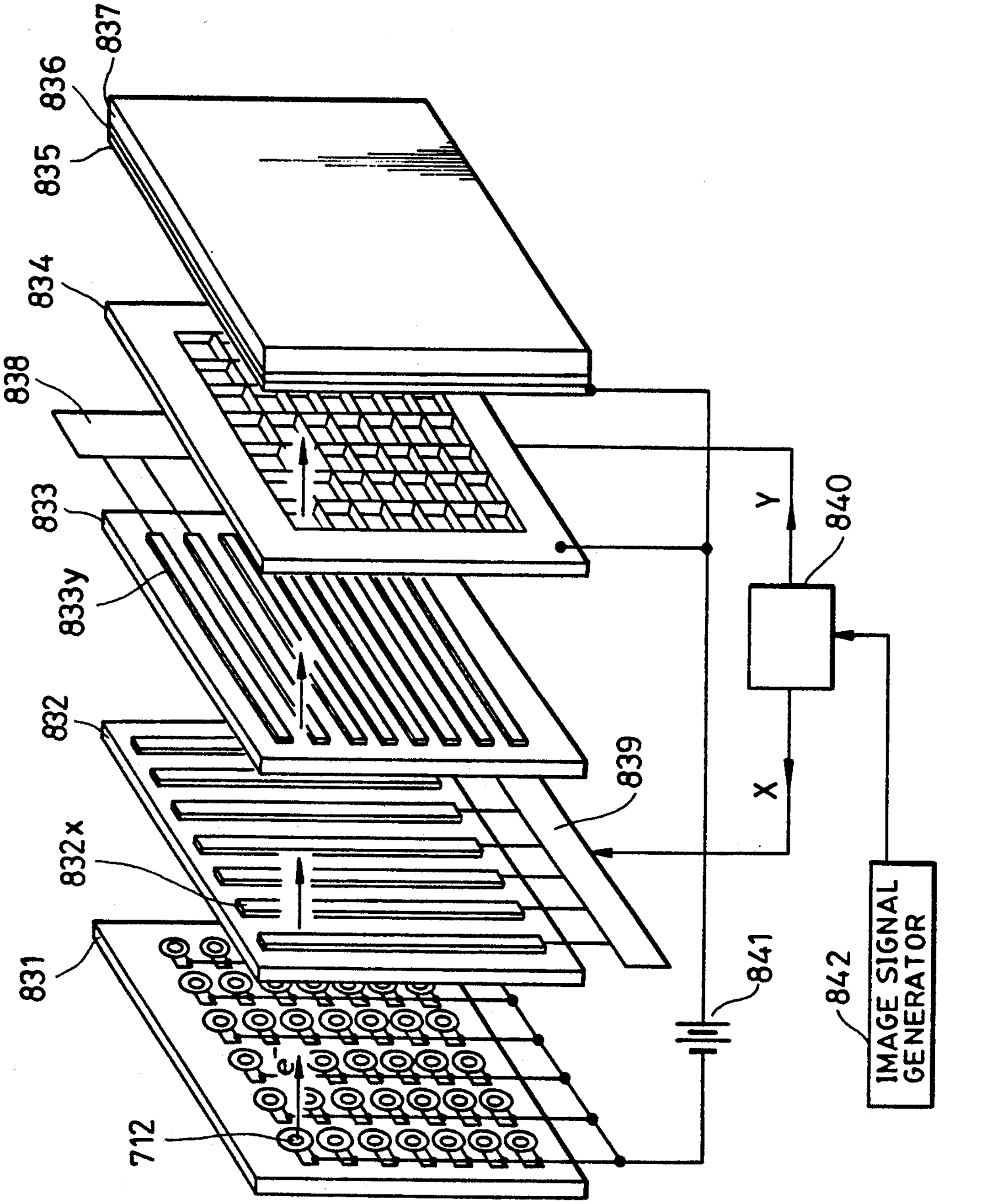
FIG. 8 is a schematic view of a flat display to which the electron emitting device of this invention is applied.
Figure 9:
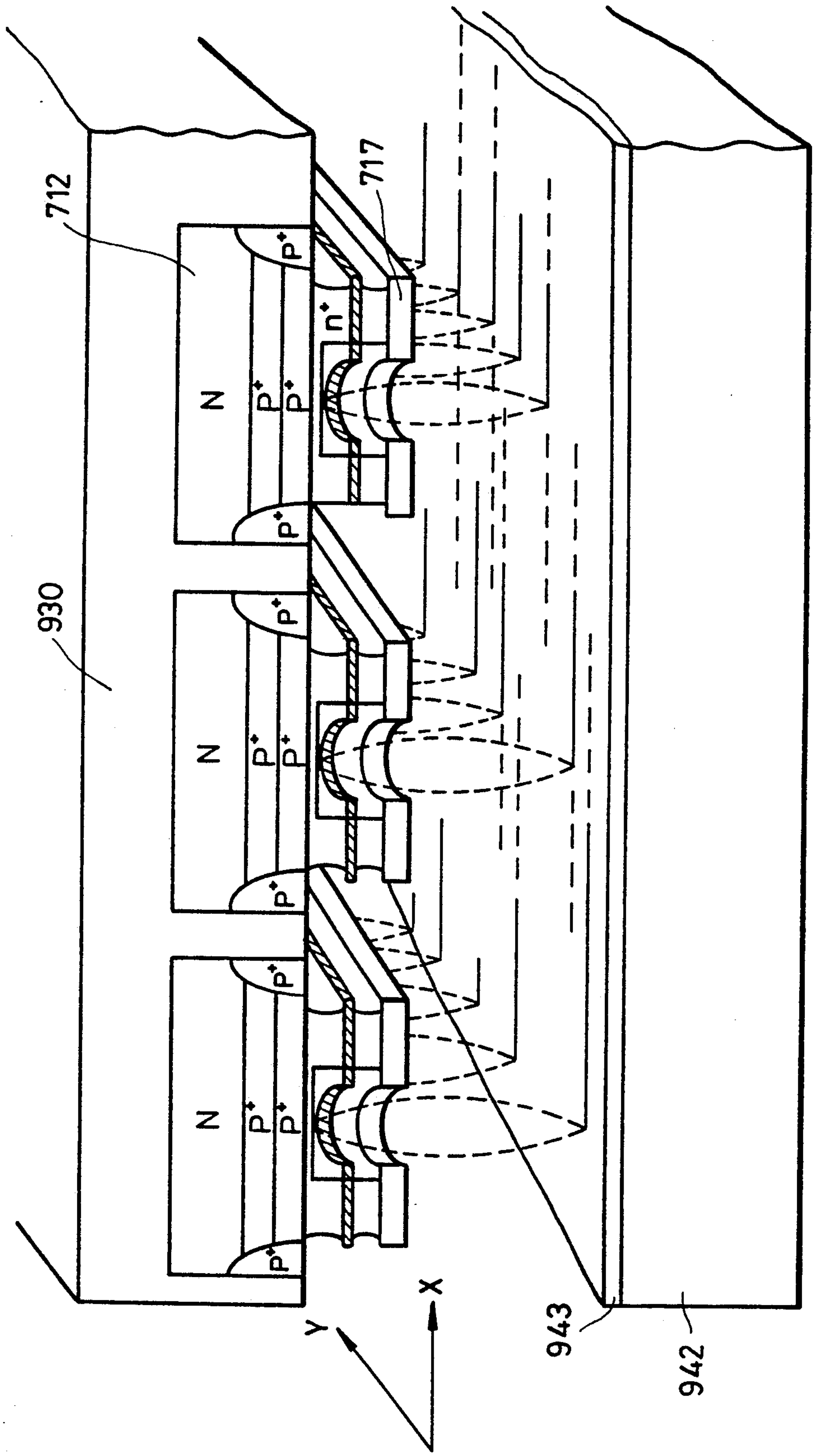
FIG. 9 is a schematic view of an electron beam drawing apparatus to which the electron emitting device of this invention is applied.

FIG. 8 shows the application in which a substrate, on which electron emitting devices of this invention are arranged in a matrix, is used as an electron source for a flat display. FIG. 9 shows the application in which the substrate is used as an electron beam drawing apparatus. Referring to FIG. 8, the flat display is comprised of a semiconductor substrate 831 on which many electron devices of this invention are arranged, X and Y control grid substrates 832 and 833 as X and Y address means, control grids 832x and 832y in the X and Y control grid substrates 832 and 833, an accelerating grid 834, a metal-backed screen 835, a fluorescent substance 836 and a transparent glass panel 837. When an image signal is input from an image signal generator 842 to a signal analyzing device 840, dots to be displayed are separated in x and y directions, an address in the X direction enters an address decoder 839 and an address in the Y direction enters an address decoder 838, both grids of the dots to be displayed in the X and Y directions convert in the directions to potentially draw the electrons from the electron emitting device, electrons for the dots to be displayed pass through the substrates 832 and 833 and reach the substrate 834. Since a high voltage 841 is applied to the substrate 834, the electrons obtain large energy, thereby brightly illuminating the fluorescent substance 836. As described above, it is possible to construct an extremely thin display with a simple structure which substitutes for a conventional CRT.

Referring to FIG. 9, numerals 930, 943 and 942 denote a substrate on which electron emitting devices of this invention are arranged in a matrix, an electron beam drawing resist and a semiconductor substrate, respectively. The on/off timing of image drawing is analyzed based on image drawing data and transmitted between the emitter and the base. If the data to be drawn is transmitted between the emitter and the base, the emitter-collector potential difference changes, emits and focuses electrons onto the substrate by the lens electrode 717, thereby exposing the electron beam resist.

According to the above structure, since an electron beam drawing system is constructed by using a substrate on which many electron emitting devices of this invention are arranged, an extremely high-precision, small and high-speed image drawing system can be produced.

What is claimed is:

1. An electron emitting device, comprising:

a first semiconductor region having a first bandgap;

a second semiconductor region for injecting electrons into said first semiconductor region, said second semiconductor region having a different conductivity type from said first semiconductor region and having said first bandgap disposed on said first semiconductor region;

a third semiconductor region having the same conductivity type as said second semiconductor region and having a second bandgap disposed on said second semiconductor region, said second bandgap being narrower than said first bandgap; and a fourth semiconductor region having an electron emitting surface disposed on said third semiconductor region.

2. An electron emitting device according to claim 1, wherein a combination of said first material and said second material is selected from the group consisting of one of the following combinations: $Al_xGa_{(1-x)}As$ ($0 \leqq x \leqq 1$) and GaAs; $Al_xGa_{(1-x)}P$ ($0 \leqq x \leqq 1$) and Si; GaAs and Ge; Si and Ge; InAs and GaSb; ZnSe and GaAs; ZnSe and Ge; and CdS and InP.

3. An electron emitting device according to claim 1, wherein said second and third semiconductor regions form a heterojunction.

4. An electron emitting device according to claim 1, further comprising a fifth layer comprising a third material having a low work function disposed on said electron emitting surface.

5. An electron emitting device according to claim 1, further comprising:

a first region disposed in at least one of said second semiconductor region and said third semiconductor region; and a second region disposed surrounding said first region, wherein said first region has a higher carrier density than that of said second region.

6. An electron emitting device, comprising:

a first semiconductor region having a first bandgap;

a second semiconductor region for injecting electrons into said first semiconductor region, said second semiconductor region having a different conductivity type from said first semiconductor region and having said first bandgap disposed on said first semiconductor region;

a third semiconductor region having the same conductivity type as said second semiconductor region and having a second bandgap disposed on said second semiconductor region, said second bandgap being narrower than the first bandgap;

a fourth semiconductor region having an electron emitting surface disposed on said third semiconductor region; and means for applying a bias voltage to said second, third and fourth semiconductor regions.

7. An electron emitting device having a transistor structure, comprising:

an emitter;

a base region;

a collector region having an electron emitting region;

means for applying a reverse bias voltage between said base region and said collector region; and means for applying a bias voltage between said base region and said emitter region, wherein said base region comprises a first base portion having a first bandgap, and a second base portion having a second bandgap narrower than said first bandgap, and wherein said first base portion and said second base portion from a heterojunction.

8. An electron emitting device according to claim 7, wherein the combination of said first material and said second material is selected from the group consisting of one of the following combinations: $Al_xGa_{(1-x)}As$ ($0 \leqq x \leqq 1$) and GaAs; $Al_xGa_{(1-x)}P$ ($0 \leqq x \leqq 1$) and Si; GaAs and Ge; Si and Ge; InAs and GaSb; ZnSe and GaAs; ZnSe and Ge; and CdS and InP.

9. An electron emitting device according to claim 7, further comprising a low work function layer comprising a low work function material disposed on said electron emitting layer.

10. An electron emitting device according to claim 7, further comprising:

a first region disposed in said base layer; and a second region surrounding said first region, wherein said first region has a higher carrier density than that of said second region.

11. A display apparatus, comprising:

an electron emitting device comprising a first semiconductor region having a first bandgap, a second semiconductor region for injecting electrons into the first semiconductor region, said second semiconductor region having a different conductivity type from said first semiconductor region and having said first bandgap disposed on said first semiconductor region, a third semiconductor region having the same conductivity type as said second semiconductor region and having a second bandgap disposed on said second semiconductor region, said second bandgap being narrower than said first bandgap, and a fourth semiconductor region having an electron emitting surface disposed on said third semiconductor region;

deflecting means for determining the direction of movement of electrons emitted from said electron emitting device; and a fluorescent substance being disposed in the direction of movement of said electrons.

12. An electron emitting apparatus including a plurality of electron emitting devices arranged in a matrix on a substrate, said electron emitting devices each comprising:

a first semiconductor region having a first bandgap;

a second semiconductor region for injecting electrons into said first semiconductor region, said second semiconductor region having a different conductivity type from said first semiconductor region and having said first bandgap disposed on said first semiconductor region;

a third semiconductor region having the same conductivity type as said second semiconductor region and having a second bandgap disposed on said second semiconductor region, the second bandgap being narrower than the first bandgap; and a fourth semiconductor region having an electron emitting surface disposed on said third semiconductor region.

13. A display apparatus, comprising:

an electron emitting apparatus including a plurality of electron emitting devices arranged in a matrix on a substrate, said electron emitting devices each comprising a first semiconductor region having a first bandgap, a second semiconductor region for injecting electrons into said first semiconductor region, said second semiconductor region having a different conductivity type from said first semiconductor region and having said first bandgap disposed on said first semiconductor region, a third semiconductor region having the same conductivity type as said second semiconductor region and having a second bandgap disposed on said second semiconductor region, the second bandgap being narrower than said first bandgap, and a fourth semiconductor region having an electron emitting surface disposed on said third semiconductor region;

an image signal generator;

X and Y address means for determining the direction of movement of electrons emitted from said electron emitting apparatus; and a fluorescent substance being disposed in the direction of movement of said electrons.

14. An electron beam drawing apparatus, comprising:

an electron emitting apparatus including a plurality of electron emitting devices arranged in a matrix on a substrate, said electron emitting devices each comprising a first semiconductor region having a first bandgap, a second semiconductor region for injecting electrons into said first semiconductor region, said second semiconductor region having a different conductivity type from said first semiconductor region and having said first bandgap disposed on said first semiconductor region, a third semiconductor region having the same conductivity type as said second semiconductor region and having a second bandgap disposed on said second semiconductor region, said second bandgap being narrower than said first bandgap, and a fourth semiconductor region having an electron emitting surface disposed on said third semiconductor region;

means for focusing electrons emitted by said electron emitting apparatus; and means for controlling a first period of time when said electron emitting apparatus emits the electrons in accordance with said focusing means and for controlling a second period of time when said electron emitting apparatus is prohibited from emitting the electrons.

* * * * *

UNITED STATES PATENT AND TRADEMARK OFFICE
CERTIFICATE OF CORRECTION

PATENT NO. : 5,285,079

DATED : February 8, 1994

INVENTOR(S) : TAKEO TSUKAMOTO, ET AL.

It is certified that error appears in the above-identified patent and that said Letters Patent is hereby corrected as shown below:

ON TITLE PAGE

In [56] References Cited, under OTHER PUBLICATIONS:

In "Schade et al,", "Cold Cathode" should read --Cold-Cathode--.
In "Kan et al,", "Tromson" should read --IEEE Transactions--.
In "Clark et al," "heterojunction Structure" should read --A(GaAl)As-GaAs heterojunction structure--.

COLUMN 7

Line 20, "from" should read --form--.

Signed and Sealed this

Fifth Day of July, 1994

Attest:

BRUCE LEHMAN

*Attesting Officer*

*Commissioner of Patents and Trademarks*